(12) United States Patent
Lin

(10) Patent No.: US 9,166,037 B2
(45) Date of Patent: Oct. 20, 2015

(54) POWER SEMICONDUCTOR DEVICE WITH ELECTROSTATIC DISCHARGE STRUCTURE

(75) Inventor: Wei-Chieh Lin, Hsinchu (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 648 days.

(21) Appl. No.: 13/101,155

(22) Filed: May 5, 2011

(65) Prior Publication Data

US 2012/0193701 A1    Aug. 2, 2012

(30) Foreign Application Priority Data

Jan. 27, 2011    (TW) ............................. 100103026 A

(51) Int. Cl.

| | |
|---|---|
| H01L 27/02 | (2006.01) |
| H01L 29/78 | (2006.01) |
| H01L 29/66 | (2006.01) |
| H01L 29/06 | (2006.01) |
| H01L 29/417 | (2006.01) |

(52) U.S. Cl.
CPC ........ *H01L 29/7813* (2013.01); *H01L 27/0248* (2013.01); *H01L 27/0255* (2013.01); *H01L 27/0259* (2013.01); *H01L 29/66727* (2013.01); *H01L 29/66734* (2013.01); *H01L 29/7808* (2013.01); *H01L 29/0653* (2013.01); *H01L 29/41766* (2013.01)

(58) Field of Classification Search
CPC ............ H01L 27/0248; H01L 27/0251; H01L 27/0266; H01L 27/0255; H01L 29/7813; H01L 29/7808; H01L 29/66727; H01L 29/66734; H01L 29/0653; H01L 29/41766; H01L 27/0259
USPC ......... 257/334, 173, 355, 366, 360, 357, 322, 257/481, 551, 603; 438/270
See application file for complete search history.

(56) References Cited

U.S. PATENT DOCUMENTS

| | | | |
|---|---|---|---|
| 5,070,377 A | 12/1991 | Harada | |
| 7,378,884 B2 | 5/2008 | Bhalla | |
| 7,511,357 B2 * | 3/2009 | Hshieh | ........................ 257/551 |
| 8,198,684 B2 * | 6/2012 | Lin et al. | ....................... 257/355 |
| 8,501,580 B2 * | 8/2013 | Hu et al. | ....................... 438/424 |
| 2009/0212354 A1 * | 8/2009 | Hsieh | ........................... 257/328 |
| 2010/0200920 A1 | 8/2010 | Su | |

* cited by examiner

*Primary Examiner* — Zandra Smith
*Assistant Examiner* — Lauren R Bell
(74) *Attorney, Agent, or Firm* — Winston Hsu; Scott Margo

(57) ABSTRACT

A power semiconductor device with an electrostatic discharge (ESD) structure includes an N-type semiconductor substrate, at least one ESD device, and at least one trench type transistor device. The N-type semiconductor has at least two trenches, and the ESD device is disposed in the N-type semiconductor substrate between the trenches. The ESD device includes a P-type first doped region, and an N-type second doped region and an N-type third doped region disposed in the P-type first doped region. The N-type second doped region is electrically connected to a gate of the trench type transistor device, and the N-type third doped region is electrically connected to a drain of the trench type transistor device.

8 Claims, 12 Drawing Sheets

POWER SEMICONDUCTOR DEVICE WITH ELECTROSTATIC DISCHARGE STRUCTURE

BACKGROUND OF THE INVENTION

1. Field of the Invention

The present invention relates to a power semiconductor device and a manufacturing method thereof, and more particularly, to a power semiconductor device with an electrostatic discharge structure and a manufacturing method thereof.

2. Description of the Prior Art

Power metal-oxide-semiconductor (MOS) transistor devices have conductive properties of high voltage and high current, and thus are easily damaged due to electrostatic discharge (ESD) pulses. To obtain a lower threshold voltage in more current integrated circuit manufacturing processes, thickness of a gate oxide layer of the power MOS transistor device is reduced. Therefore, the power MOS transistor device is easily damaged by ESD pulses caused by static electricity or other uncontrollable factors. To solve this problem, ESD devices are combined with the power MOS transistor device to protect the power MOS transistor device from being damaged. In existing techniques for fabricating the power MOS transistor device, a process used to fabricate the ESD devices is performed after the power MOS transistor device is fabricated. Accordingly, extra processes are required, which raise the fabricating cost.

Please refer to FIG. 1, which illustrates a cross-sectional view of a power semiconductor device according to the prior art. As shown in FIG. 1, the power semiconductor device 10 according to the prior art includes a plurality of trench type transistor devices 14 and a plurality of ESD devices 16 formed on a semiconductor substrate 12. The ESD devices 16 are formed by the following steps. A polycrystalline silicon layer 18 is formed, and then a P-ion implantation process and an N-ion implantation process are performed on the polycrystalline silicon layer 18 in sequence to form a plurality of P-doped regions 20 and a plurality of N-doped regions 22. The P-doped regions 20 and the N-doped regions 22 are alternately connected to each other in sequence. Any P-doped region 20 and the N-doped region 22 adjacent thereto form an ESD device 16 with a P-N junction, and the ESD devices 16 are connected between a gate electrode and a drain electrode of the trench type transistor device in series.

As mentioned above, conventional ESD devices are formed by doping the polycrystalline silicon layer. Since the lattice structure of the polycrystalline silicon layer limits current transmitted therein, the ESD devices have limited ability to discharge electrostatic charges due to the lattice structure of the polycrystalline silicon layer. Thus, raising the ability of the ESD devices to discharge the electrostatic charges in the power semiconductor devices is an objective in this field.

SUMMARY OF THE INVENTION

It is therefore one of the objectives to provide a power semiconductor device with an ESD structure to raise the ability of discharging electrostatic charges of the ESD devices.

In accordance with the present invention, a power semiconductor device with an ESD structure is provided. The power semiconductor device includes a semiconductor substrate, at least a first ESD device and at least a trench type transistor device. The semiconductor substrate has a first conductive type, and the semiconductor substrate includes a first component region and a second component region. An upper surface of the semiconductor substrate has at least two first trenches, and the first trenches are located in the second component region. The first ESD device includes a first doped region, a second doped region, and a third doped region. The first doped region has a second conductive type, and the second conductive type is different from the first conductive type. The second doped region has the first conductive type and is disposed at a side close to the first component region in the first doped region. The third doped region has the first conductive type and is disposed at a side away from the first component region in the first doped region. The trench type transistor device is disposed in the first component region, and the trench type transistor device includes a gate electrode, a source electrode, and a drain electrode. The second doped region is electrically connected to the gate electrode, and the third doped region is electrically connected to the drain electrode.

In accordance with the present invention, another power semiconductor device with the ESD structure is provided. The power semiconductor device includes a semiconductor substrate, at least a second ESD device and at least a trench type transistor device. The semiconductor substrate has a first conductive type, and the semiconductor substrate includes a first component region and a third component region. An upper surface of the semiconductor substrate has at least two second trenches, and the second trenches are located in the third component region. The second ESD device includes a fourth doped region, a fifth doped region, and a sixth doped region. The fourth doped region has a second conductive type, and the second conductive type is different from the first conductive type. The fifth doped region has the first conductive type and is disposed at a side close to the first component region in the fourth doped region. The sixth doped region has the first conductive type and is disposed at a side away from the first component region in the fourth doped region. The trench type transistor device is disposed in the first component region, and the trench type transistor device includes a gate electrode, a source electrode, and a drain electrode. The fifth doped region is electrically connected to the source electrode, and the sixth doped region is electrically connected to the gate electrode.

In accordance with the present invention, a manufacturing method of the power semiconductor device with an ESD structure is provided. The manufacturing method is taken as followed. A semiconductor substrate having a first conductive type is provided, the semiconductor substrate has a first component region and a second component region, and an upper surface of the semiconductor substrate in the second component region includes at least two first trenches. Then, at least one trench type transistor device and at least one first ESD device are respectively formed in the first component region and the second component region. The first ESD device includes a first doped region disposed between the first trenches, a second doped region disposed at a side close to the first component region in the first doped region, and a third doped region disposed at a side away from the first component region in the first doped region. The trench type transistor device includes a gate electrode, a drain electrode, and a source electrode. Afterward, an interlayer dielectric layer is formed on the semiconductor substrate. Next, at least first contact hole is formed in the first component region, and a second contact hole is formed in the second doped region and the third doped region respectively. Each second contact hole is exposed to the second doped region and the third doped region respectively, and penetrates the interlayer dielectric layer. The first contact hole penetrates the source electrode and the interlayer dielectric layer. Next, a source contact plug is formed in the first contact hole in the first component region, and a second contact plug is formed in each second contact hole respectively.

In the present invention, first ESD devices are formed on the semiconductor substrate to lower resistances of the first ESD devices and thus to improve the ability of releasing static electricity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
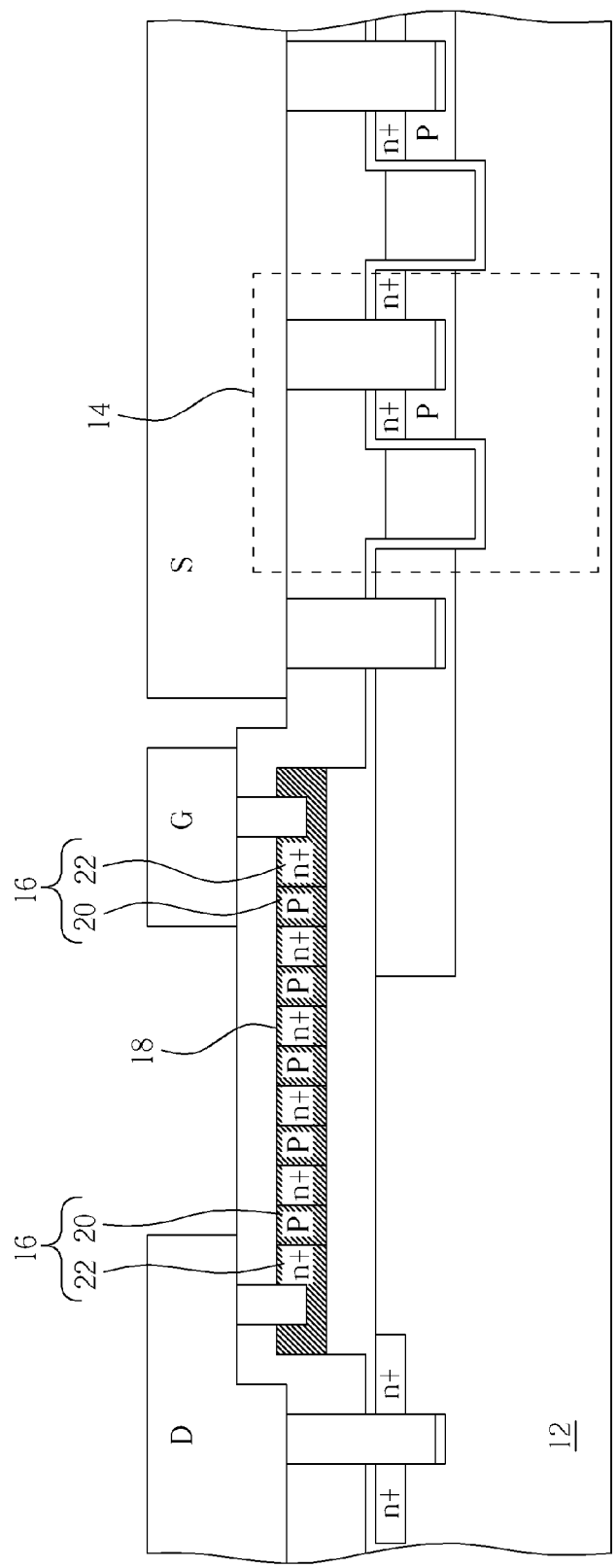
FIG. 1 is a schematic diagram illustrating a cross-sectional view of a power semiconductor device according to the prior art.
Figure 2:
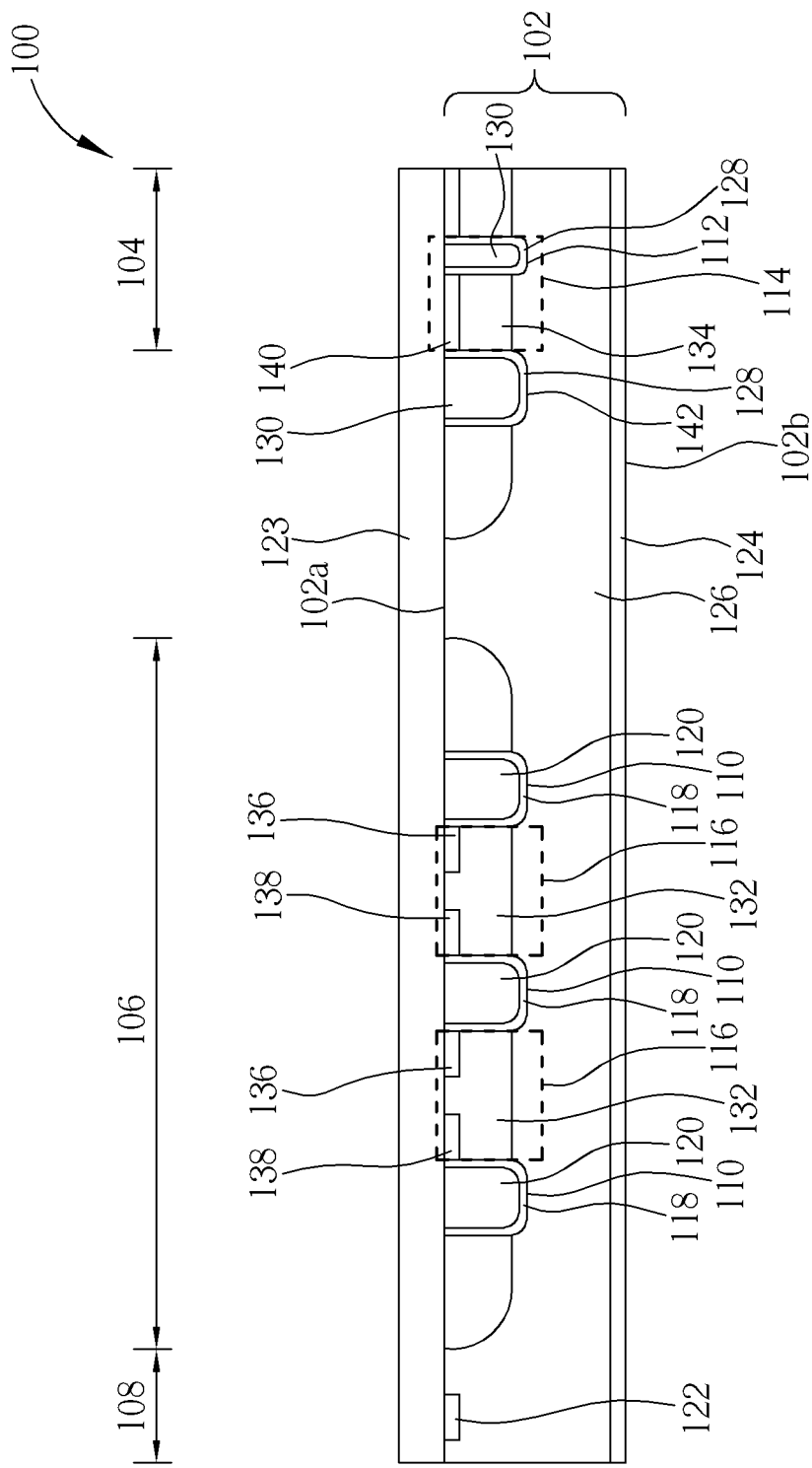
FIG. 2 through FIG. 5 are schematic diagrams illustrating a manufacturing method of a power semiconductor device with an ESD structure according to a first embodiment of the present invention.

Please refer to FIG. 2 through FIG. 5, which schematically illustrate a method of manufacturing a power semiconductor device with an ESD structure according to a first embodiment of the present invention. As shown in FIG. 2, a semiconductor substrate 102 having a first conductive type is provided, and the semiconductor substrate 102 includes a first component region 104, a second component region 106, and a drain connecting region 108 located thereon. An upper surface 102a of the semiconductor substrate 102 has a plurality of first trenches 110 and a third trench 112. The first trenches 110 are disposed in the second component region 106, and the third trench 112 is disposed in the first component region 104. Subsequently, a trench type transistor device 114 is formed in the first component region 104; a plurality of first ESD devices 116 are formed in the second component region 106; an insulating layer 118 and a conductive layer 120 are formed in each first trench 110 in the second component region 106, respectively; and a doped drain region 122 is formed in the semiconductor substrate 102 in the drain connecting region 108. Each first ESD device 116 is disposed between any two adjacent first trenches 110, and the doped drain region 122 has the first conductive type. Then, an interlayer dielectric layer 123 is disposed on the semiconductor substrate 102. In this embodiment, the first conductive type is N-type, but not limited thereto. The N-type semiconductor substrate 102 includes an N-type substrate 124 and an N-epitaxial layer 126 disposed on the N-type substrate 124. The N-type substrate 124 can be a silicon wafer, but is not limited thereto. In addition, a number of the first ESD devices 116 used in the present invention is not limited to being more than one, but can also be only one. The number of the first ESD devices 116 can be determined according to the required ESD performance. Since the first trenches 110 are used to isolate each first ESD devices 116. from the trench type transistor device 114, a number of the first trenches 110 used in the present invention can be adjusted according to the number of the first ESD devices. 116. In the present invention, at least two first trenches 110 are required. On condition that only two first trenches 110 are disposed, the power semiconductor device 100 only includes one first ESD device 116, and thus no metal layer is required to connect the first ESD devices 116 in series. Moreover, number of the third trenches 112 used in the present invention is not limited to being one. The third trench 112 is used to form a gate electrode of the trench type transistor device 114, so that the number of the third trenches 112 can be determined according to a number of the trench type transistor devices 114. The number of the trench type transistor devices 114 used in the present invention can also be more than one; therefore, the number of the third trenches 112 can be more than one. In this embodiment, two first ESD devices 116, three first trenches 110, one trench type transistor device 114, and one third trench 112 disposed in the semiconductor substrate 102 are taken as an example, but is not limited thereto.

In this embodiment, the steps of manufacturing the trench type transistor device 114, the first ESD devices 116, the insulating layer 118, the conductive layer 120, and the doped drain region 122 are performed as following description. First, an oxide layer, such as silicon oxide, and a polycrystalline silicon layer are disposed on the N-type semiconductor substrate 102 in sequence. Then, an etch-back process or a polishing process is performed to simultaneously form the insulating layer 118 and the conductive layer 120 in each first trench 110 in the second component region 106, and also to form a gate insulating layer 128 and a gate conductive layer 130 in the third trench 112. Next, an ion implantation process of a second conductive type is performed to form first doped regions 132 in the N-type semiconductor substrate 102 at two sides of each first trench 110, and also to form doped body regions 134 in the N-type semiconductor substrate 102 at two sides of the third trench 110. The first doped regions 132 and the doped body regions 134 have the second conductive type. In this embodiment, the second conductive type is different from the first conductive type, i.e. P type, but not limited thereto. In the present invention, the first conductive type and the second conductive type can be exchanged. The insulating layer 118 covers a sidewall of each first trench 110, and the conductive layer 120 is disposed on the insulating layer 118 disposed in each first trench 110. Additionally, the gate insulating layer 128 covers a sidewall of the third trench 112, and the gate conductive layer 130 is disposed on the gate insulating layer 128 disposed in the third trench 112.

Afterward, an N-type ion implantation process is performed to form an N-type second doped region 136 and an N-type third doped region 138 in each P-type first doped region 132 between any two adjacent first trenches 110, and to form an N-doped source region 140 in each P-doped body region 134. Also, the N-doped drain region 122 is formed in the N-type semiconductor substrate 102 in the drain connecting region 108. Each set of the P-type first doped region 132, the corresponding N-type second doped region 136, and the corresponding N-type third doped region 138 constitutes a bidirectional diode with N-P-N structure, so as to serve as each first ESD device 116. Each first ESD device 116 is located between any two adjacent first trenches 110 in the N-type semiconductor substrate 102. In this embodiment, each N-type second doped region 136 is in contact with the adjacent first trench 110 located close to the first component region 104, and each N-type third doped region 138 is in contact with the adjacent first trench 110 located away from the first component region 104. In other words, the N-type second doped region 136 and the N-type third doped region 138 from different first ESD devices 116 are disposed in the P-type first doped regions 132 located at two sides of each first trench 110. Additionally, the gate conductive layer 130, the gate insulating layer 128, the N-type semiconductor substrate 102, each P-doped body region 134, and each N-doped source region 140 constitute an NMOS transistor device, so as to serve as the trench type transistor device 114 in this embodiment. It is noted that the steps of manufacturing the trench type transistor device 114, the first ESD devices 116, the insulating layer 118, and the conductive layer 120 are not limited thereto. In other embodiments of the present invention, the semiconductor substrate 102 can be P type, and the trench type transistor device 114 can be P type. In other words, the first conductive type and the second conductive type can be exchanged, i.e. the first conductive type is P type, and the second conductive type is N type. Thus, each first ESD device 116 is the bidirectional diode device with P-N-P structure.

Moreover, the P-type first doped region 132 closest to the first component region 104 is disposed at a side of the first trench 110 close to the first component region 104, and the second doped region 136 has no N-type second doped region 136 and no N-type third doped region 138 disposed therein. Also, the P-type first doped region 132 furthest from the first component region 104 is disposed at a side of the first trench 110 away from the first component region 104, and the second doped region 136 has no N-type second doped region 136 and no N-type third doped region 138 disposed therein. In addition to the steps of forming the first trenches 110 and the third trench 112, a step of forming a fourth trench 142 is included. The fourth trench 142 is formed between the first component region 104 and the second component region 106 in the N-type semiconductor substrate 102. The fourth trench 142 and the third trench 112 are conducted to each other, so that the fourth trench 142 also has the gate insulating layer 128 and the gate conductive layer 130 disposed therein.

Figure 3:
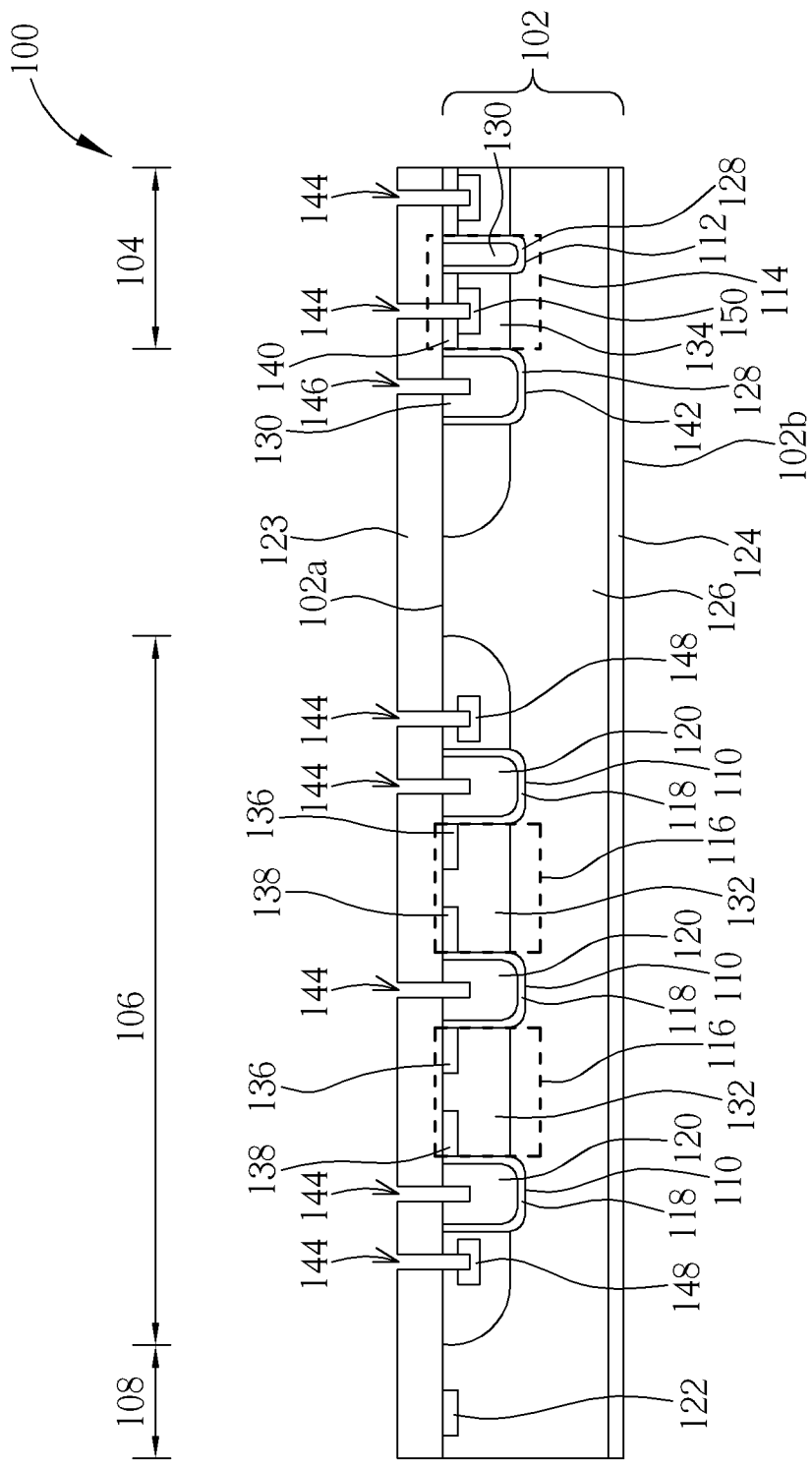

As shown in FIG. 3, after steps of forming the trench type transistor device 114, the first ESD device 116, the insulating layer 118, the conductive layer 120, and the doped drain region 122, a first mask is used to form a first contact hole 144 on each P-doped body region 134 in the first component region 104 and the conductive layer 120, respectively, and to form a third contact hole 146 on the gate conductive layer 130 in the fourth trench 142 simultaneously, so that the first contact holes 144 and the third contact hole 146 have the same depth. Moreover, each first contact hole 144 and third contact hole 146 formed on the conductive layer 120 penetrates the interlayer dielectric layer 123, and each first contact hole 144 formed in each P-doped body region 134 penetrates the N-doped source region 140 and the interlayer dielectric layer 123. In this embodiment, the first contact holes 144 are also formed in the P-type first doped region 132 closest to the first component region 104 and the P-type first doped region 132 furthest from the first component region 104, respectively. Then, a P-ion implantation process is performed to form a P-type first doped contact region 148 in the P-type first doped region 132 closest to the first component region 104 and the P-type first doped region 132 furthest from the first component region 104, respectively, and to form a P-type second doped contact region 150 in each P-doped body region 134.

Figure 4:
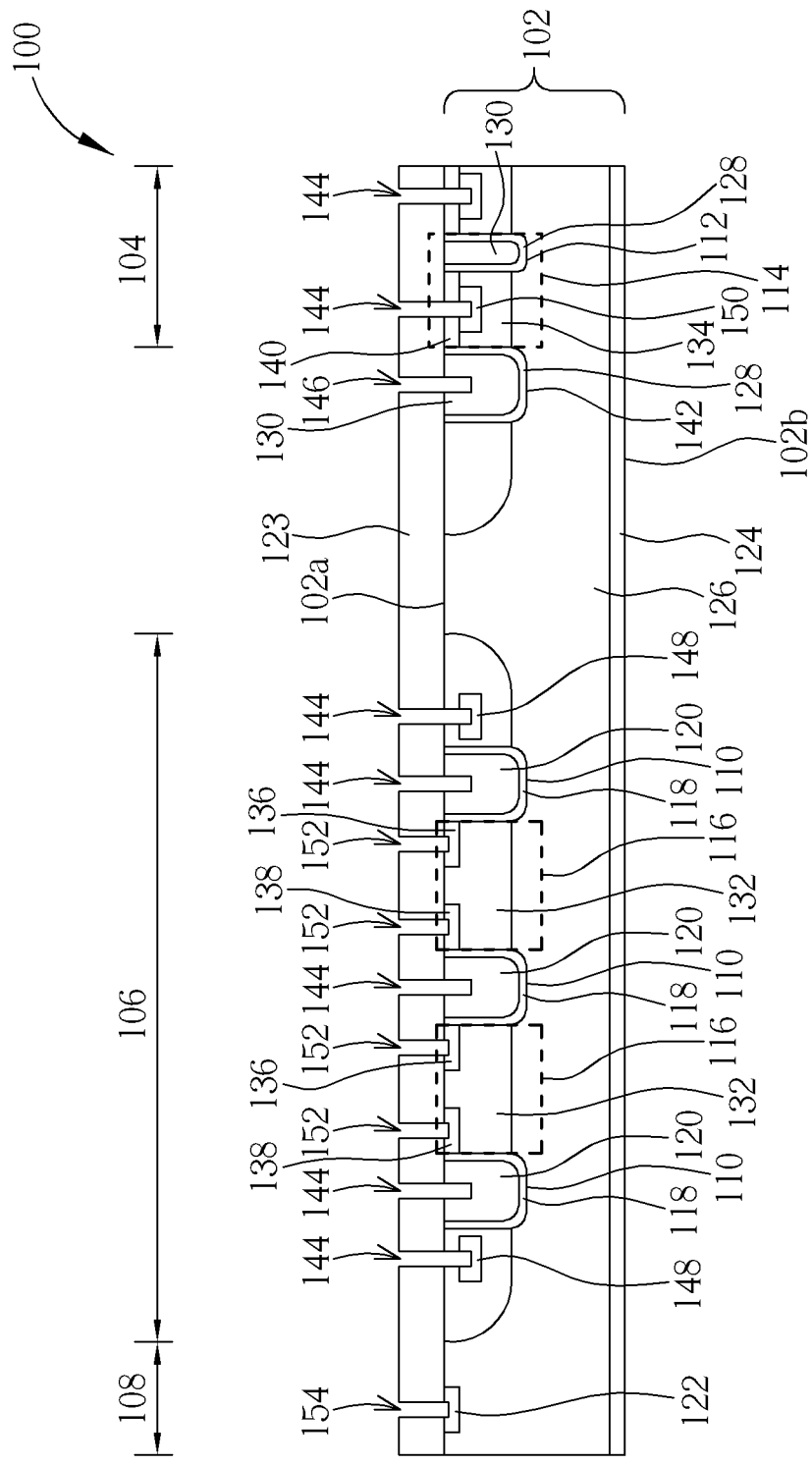

As shown in FIG. 4, a second mask is then used to form a second contact hole 152 on each N-type second doped region 136 and each N-type third doped region 138, respectively, and also to form a fourth contact hole 154 on the N-type doped drain region 122. The second contact holes 152 penetrate the interlayer dielectric layer 123 and expose the N-type second doped regions 136 and the N-type third doped regions 138, and the fourth contact hole 154 penetrates the interlayer dielectric layer 123 and exposes the N-type the doped drain region 122. The second contact holes 152 and the fourth contact hole 154 have the same depth, and the depths of each second contact hole 152 and each fourth contact hole 154 are substantially less than the depths of each first contact hole 144 and each third contact hole 146. It is noted that each second contact hole 152 does not penetrate each N-type second doped region 136 and each N-type third doped region 138, and thus a second contact plug subsequently formed in each second contact hole is not in contact with each P-type first doped region 132. Therefore, the first ESD devices 116 do not malfunction due to the contact between the second contact plug and each P-type first doped region 132. In other embodiments of the present invention, the step of forming the first contact holes 144 and the third contact hole 146 is not limited to being taken prior to the step of forming the second contact hole 152 and the fourth contact hole 154. Also, the step of forming the first contact hole 144 and the third contact hole 146 can be taken after the step of forming the second contact hole 152 and the fourth contact hole 154.

Figure 5:
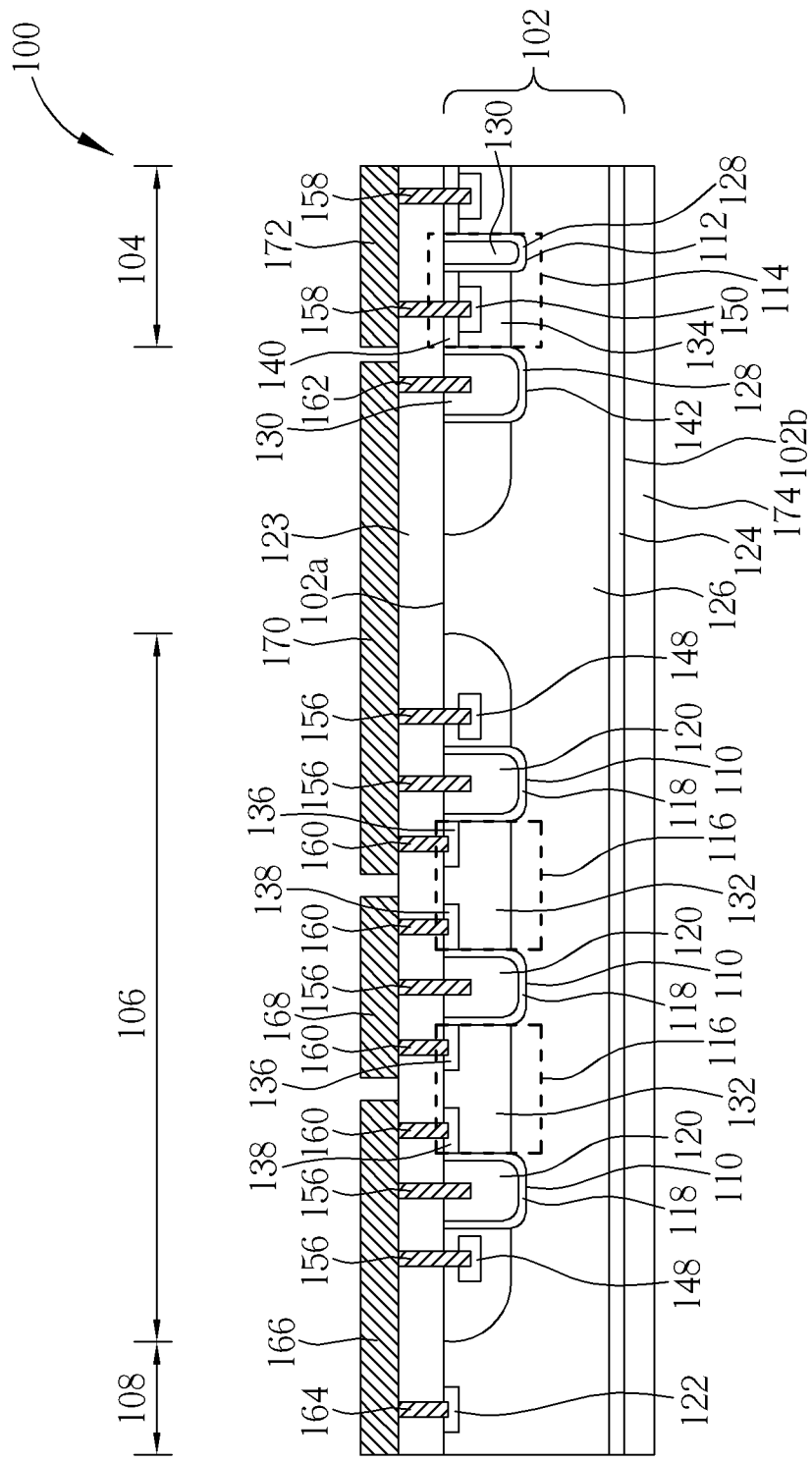

As shown in FIG. 5, a first contact plug 156 is then formed in each first contact hole 144 in the second component region 106, respectively; a source contact plug 158 is formed in each first contact hole 144 in the first component region 104, respectively; a second contact plug 160 is formed in second each contact hole 152, respectively; a third contact plug 162 is formed in each third contact hole 146, respectively; and a fourth contact plug 164 is formed in the fourth contact hole 154. Next, a first drain metal layer 166, at least one first connecting metal layer 168, a gate metal layer 170, and a source metal layer 172 are formed on the N-type semiconductor substrate 102. The first connecting metal layer 168 is disposed between the first drain metal layer 166 and the gate metal layer 170, and the gate metal layer 170 is disposed between the first connecting metal layer 168 and the source metal layer 172. Then, a second drain metal layer 174 is formed on a lower surface 102b of the N-type semiconductor substrate 102. Thus, the power semiconductor device 100 according to this embodiment is completed. Since the second drain metal layer 174 is formed on the lower surface 102b of the N-type semiconductor substrate 102, timing of forming the second drain metal layer 174 is not limited to this step. The step of forming the second drain metal layer 174 can be performed in other steps, for example, before or after the processes of forming devices on the upper surface 102a of the N-type semiconductor substrate 102. Since the depths of each second contact hole 152 and the fourth contact hole 154 are substantially less than the depths of each first contact hole 144 and the third contact hole 146, depths of each first contact plug 156, the third contact plug 162, and each source contact plug 158 are substantially less than depths of each second contact plug 160 and the fourth contact plug 164.

In this embodiment, the first connecting metal layer 168 is disposed on each first trench 110 located between any two adjacent first ESD devices 116, so as to be in contact with the first contact plug 156 disposed on the first trench 110, and thus the first connecting metal layer 168 is electrically connected to the conductive layer 120 disposed in the first trench 110. Additionally, the first connecting metal layer 168 is further extended to partially overlap two adjacent first ESD devices 116, so as to be in contact with the second contact plug 160 adjacent to the corresponding first contact plug 156, and thus to be electrically connected to the N-type second doped region 136 and the N-type third doped region 138 located adjacent to the same first trench 110. In other words, the N-type third doped region 138 of the first ESD device 116 located at a side of each first trench 110 close to the first component region 104 is electrically connected to the N-type second doped region 136 of the first ESD device 116 located at a side of each first trench 110 away from the first component region 104. Therefore, any two adjacent first ESD devices 116 can be electrically connected to each other in series. Moreover, number of first connecting metal layers 168 in this embodiment is not limited to being one. The number of the first connecting metal layers 168 can be determined according to the number of the first ESD devices 116, so as to connect the first ESD devices 116 in series. Also, the first drain metal layer 166 is disposed on the N-type semiconductor substrate 102 in the drain connecting region 108, and in contact with the fourth contact plug 164, so as to be electrically connected to the N-type doped drain region 122 and the N-type semiconductor substrate 102 serving as a drain electrode of the trench type transistor device 114. Additionally, the first drain metal layer 166 is further extended to overlap the N-type third doped region 138 of the first ESD device 116 furthest from the first component region 104, so as to be in contact with the second contact plug 160 located on the N-type third doped region 138, and thus to be electrically connected to the N-type third doped region 138 of the first ESD device 116 furthest from the first component region 104. Therefore, the drain electrode of the trench type transistor device 114 can be electrically connected to the furthest ESD device 116 from the first component region 104. Moreover, the gate metal layer 170 is in contact with the third contact plug 162, so as to be electrically connected to the gate conductive layer 130 serving as a gate electrode of the trench type transistor device 114, and the gate metal layer 170 is also in contact with the closest second contact plug 160 to the first component region 104, so as to be electrically connected to the N-type second doped region 136 of the closest first ESD device 116 to the first component region 104. Thus, the gate electrode of the trench type transistor device 114 can be electrically connected to the closest first ESD device 116 to the first component region 104. As a result, the first ESD devices 116 can be electrically connected between the gate electrode and the drain electrode of the trench type transistor device 114 in series. Also, the source metal layer 172 is in contact with the source contact plug 158 located in the first component region 104, so as to be electrically connected to each N-doped source region 140 serving as a source electrode of the trench type transistor device 114. It is noted that the first contact plug 156 and the first connecting metal layers 168 located on the conductive layer 120 are electrically connected to the N-type second doped region 136 and the N-type third doped region 138 located adjacent to the corresponding first trench 110, so that the conductive layer 120 has the same electric potential as the adjacent N-type second doped region 136 and N-type third doped region 138.

As previously mentioned, the manufacturing method of the power semiconductor device 100 in this embodiment utilizes different masks to form the first contact holes 144 and the second contact holes 152 with different depths, so as to prevent the second contact plugs 160 from penetrating the N-type second doped region 136 and the N-type third doped region 138. Thus, the P-type first doped region 132 is not electrically connected to the gate electrode or the drain electrode of the trench type transistor device 114 directly. Moreover, in this embodiment, the first ESD devices 116 are formed in the same step of forming the trench type transistor device 114, so that an extra cost for manufacturing the first ESD devices 116 can effectively be reduced.

Figure 6:
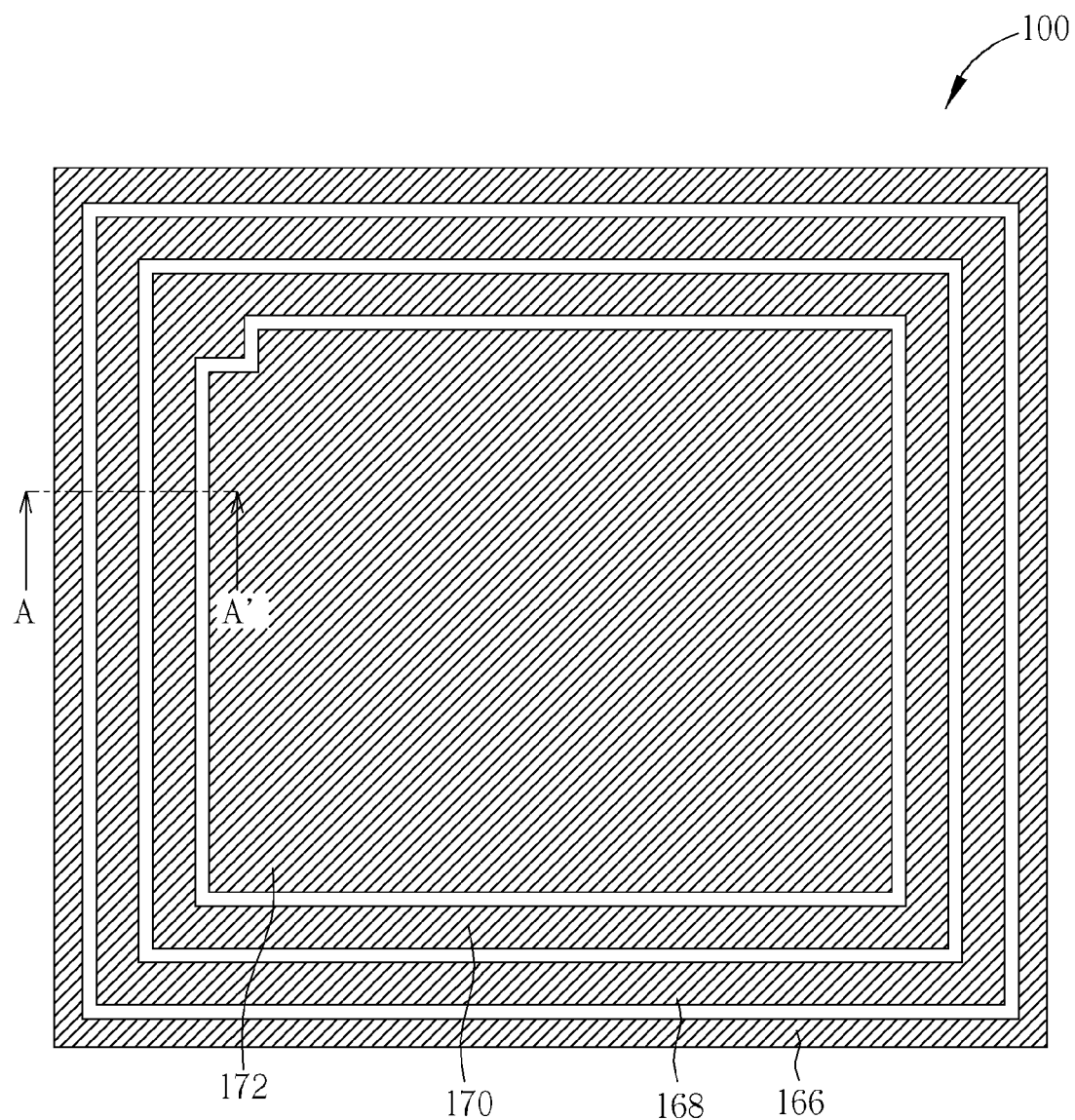
FIG. 6 is a schematic diagram illustrating a top view of a power semiconductor device according to the first embodiment of the present invention.

To clearly describe the structure of the power semiconductor device according to this embodiment, please refer to FIG. 6 and FIG. 5. FIG. 6 schematically illustrates a top view of the power semiconductor device according to the first embodiment of the present invention. FIG. 5 is a cross-sectional diagram taken along a cutting line AA' shown in FIG. 6. As shown in FIG. 5 and FIG. 6, each first ESD device 116 is disposed in the N-type semiconductor substrate 102 between two adjacent first trenches 110, and each first ESD device 116 includes a P-type first doped region 132, an N-type second doped region 136, and an N-type third doped region 138. The P-type first doped region 132 is disposed in the N-type semiconductor substrate 102, the N-type second doped region 136 is disposed in the P-type first doped region 132 close to the first component region 104, and the N-type third doped region 138 is disposed in the P-type first doped region 132 away from the first component region 104. The N-type substrate 124 and the N-epitaxial layer 126 of the N-type semiconductor substrate 102 are made of monocrystalline silicon. Since the lattice structure of monocrystalline arranges more regularly than the lattice structure of polycrystalline, the N-type semiconductor substrate 102 has less resistance as compared with polycrystalline. Accordingly, in this embodiment, the first ESD devices 116 formed in the N-type semiconductor substrate 102 have less resistance as compared with ESD devices formed in polycrystalline, so that the ability to release static electricity can be improved. In each first ESD device 116, the P-type first doped region 132 and the N-type second doped region 136 constitute a diode device with a P-N junction, such as a Zener diode, and the P-type first doped region 132 and the N-type third doped region 138 further constitute another diode device with a P-N junction. It is noted that the P regions of two diode devices belong to the same doped region, and therefore the first ESD devices 116 are bidirectionally switched off under the condition that the trench type transistor device 114 is operated in normal condition. When large electrostatic charges are generated in the gate electrode or the drain electrode of the trench type transistor device 114, and an electrostatic voltage is greater than a reverse breakdown voltage of the diode device, the static electricity can be discharged by switching on the first ESD devices 116. Additionally, in this embodiment, the first drain metal layer 166 surrounds the gate metal layer 170, the source metal layer 172, and the first connecting metal layer 168. Also, the first connecting metal layer 168 surrounds the gate metal layer 170 and the source metal layer 172. The gate metal layer 170 surrounds the source metal layer 172 as well.

Figure 7:
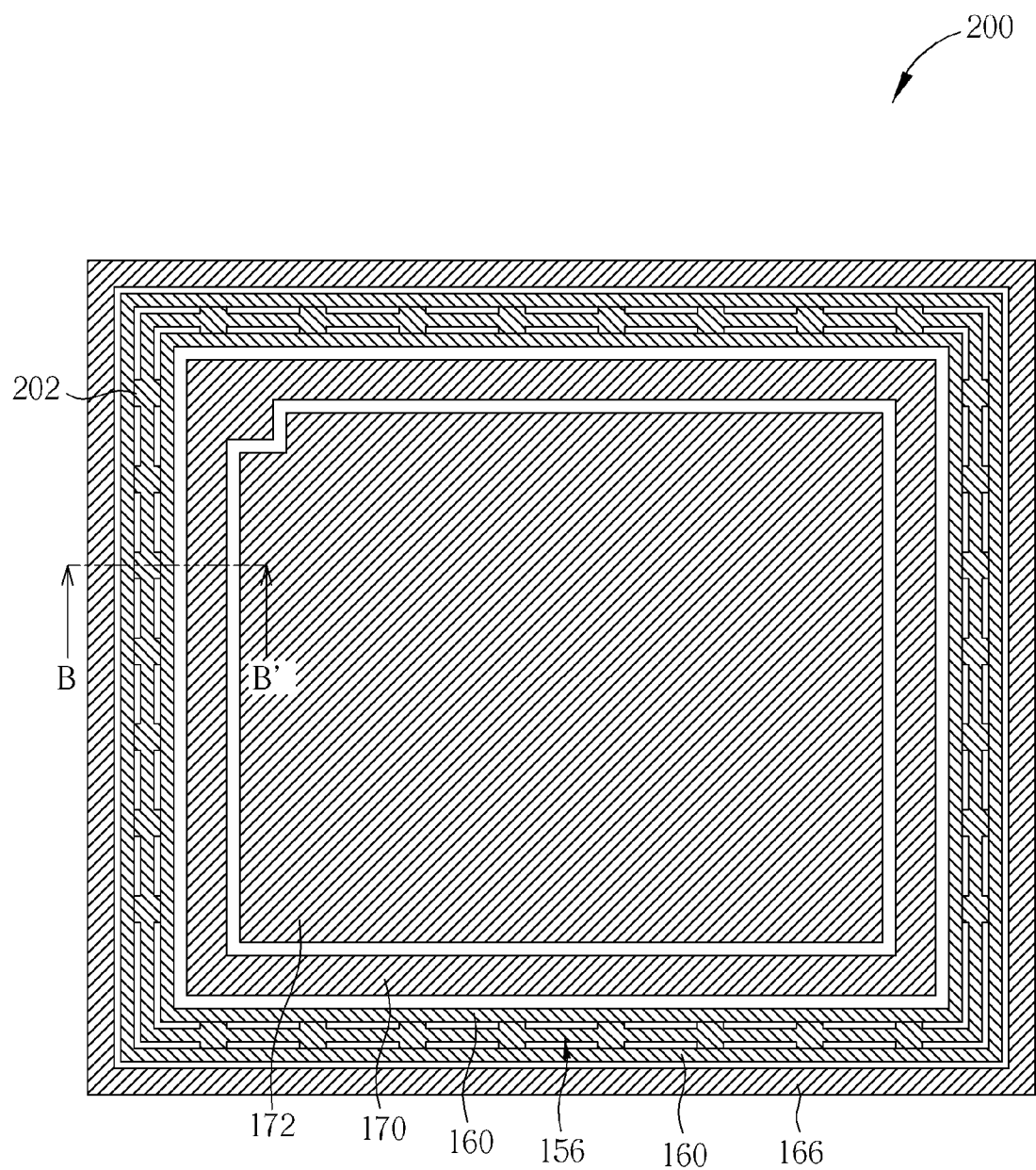
FIG. 7 is a schematic diagram illustrating a top view of a power semiconductor device according to a second embodiment of the present invention.
Figure 8:
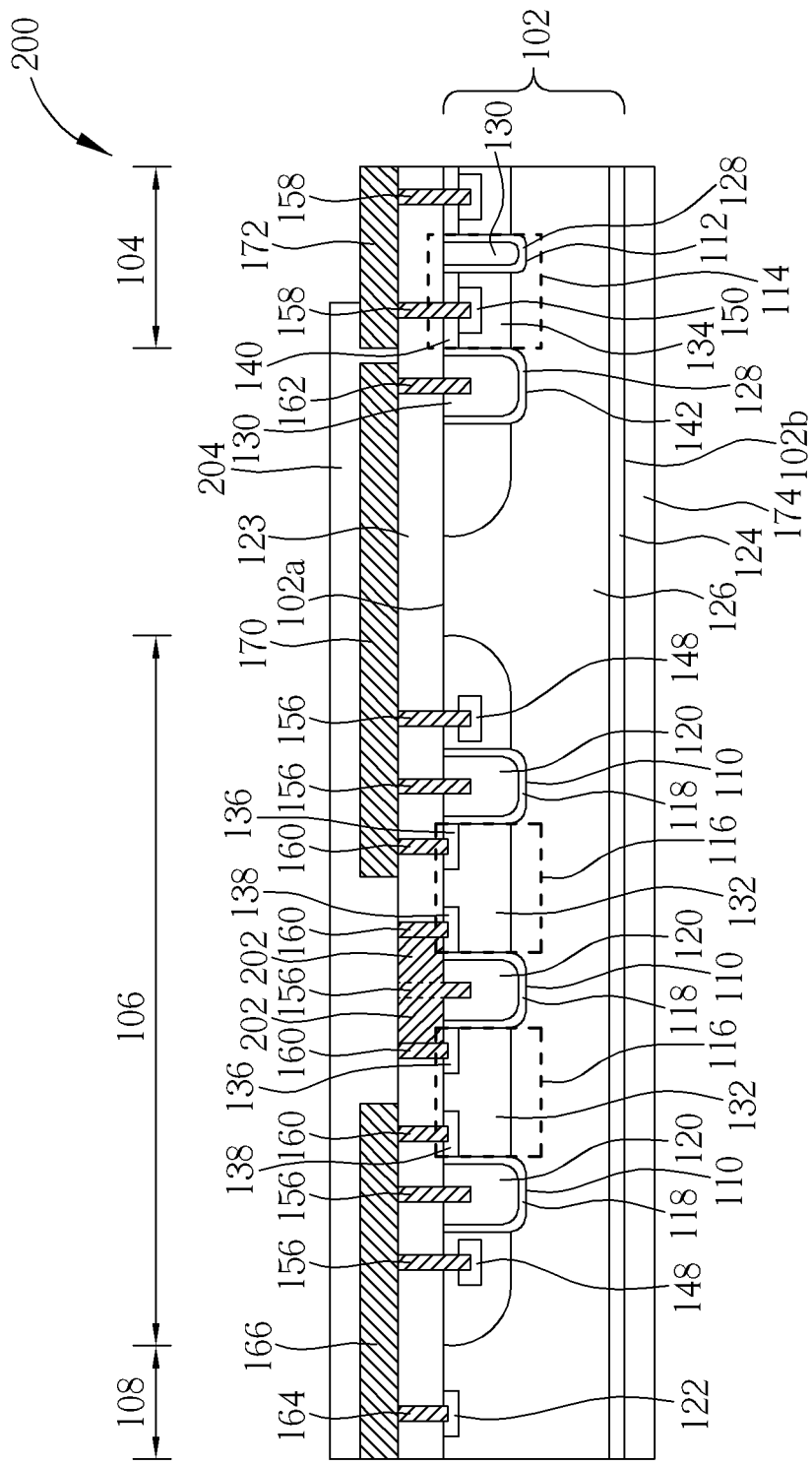
FIG. 8 is a schematic diagram illustrating a cross-sectional view of the power semiconductor device along a cutting line BB' shown in FIG. 7.

Moreover, the power semiconductor device of the present invention is not limited to using connecting metal layers to electrically connect the first ESD devices together. Contact plugs also can be directly formed to electrically connect the first ESD devices together. For the sake of clear comparison between different embodiments, identical components are denoted by identical numerals, and repeated parts are not redundantly described. Please refer to FIG. 7 and FIG. 8. FIG. 7 is a schematic diagram illustrating a top view of a power semiconductor device according to a second embodiment of the present invention, and FIG. 8 is a cross-sectional diagram taken along a cutting line BB' shown in FIG. 7. As shown in FIG. 7 and FIG. 8, compared to the first embodiment, the power semiconductor device 200 in this embodiment does not have the first connecting metal layer used to electrically connect the N-type second doped region 136 and the N-type third doped region 138 located at two sides of each first trench 110. In this embodiment, each first contact plug 156 disposed between any two adjacent first ESD devices 116 further includes a plurality of first extended parts 202. Each first extended part 202 is extended to be in contact with the second contact plug 160 adjacent thereto, so as to electrically connect the N-type second doped region 136 and the N-type third doped region 138 located at two sides of each first trench 110. In addition, the power semiconductor device 200 in this embodiment further includes a passivation layer 204 disposed on the gate metal layer 170, the first drain metal layer 166, and the source metal layer 172. Moreover, each first contact plug 156 in the present invention is not limited to having a plurality of the first extended parts 202. Each first contact plug 156 in the present invention can also have at least one first extended part 202 to electrically connect the N-type second doped region 136 and the N-type third doped region 138 located at two sides of each first trench 110. In the first embodiment, it is noted that a width of the first connecting metal layer is substantially larger than 4 micrometers, and an interval between the first connecting metal layer and the gate metal layer 170 and an interval between the first connecting metal layer and the first drain metal layer 166 are required to be larger than 4 micrometers, respectively, so that the power semiconductor device in the first embodiment utilizing the first connecting metal layer requires more than 12 micrometers to electrically connect the N-type second doped region 136 and the N-type third doped region 138. However, in this embodiment, widths of the first contact plugs 156 and the second contact plugs 160 are require only to be larger than 0.3 micrometers, and an interval between each first contact plug 156 and the second contact plug 160 adjacent thereto is required to be larger than 0.5 micrometers. Also, a width of each first trench 110 is required to be larger than 0.8 micrometers. For this reason, in this embodiment, the first extended parts 202 of the first contact plugs 156 are utilized to electrically connect the conductive layer 120 to the N-type second doped region 136 and the N-type third doped region 138, respectively, and the interval between adjacent ESD devices 116 can be effectively reduced, so as to reduce the size of the power semiconductor device 200 as compared with the first embodiment.

Figure 9:
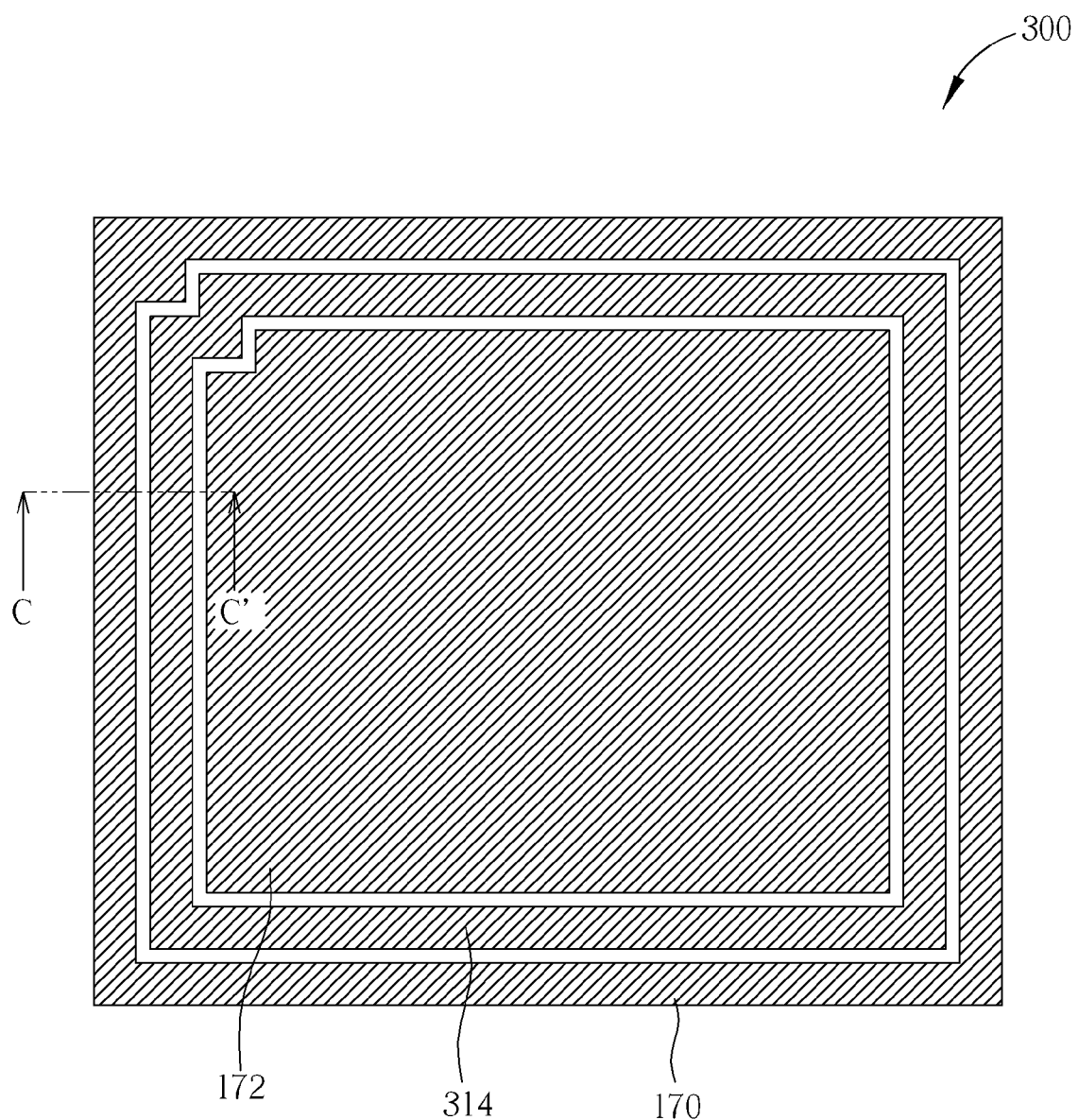
FIG. 9 is a schematic diagram illustrating a top view of a power semiconductor device according to a third embodiment of the present invention.
Figure 10:
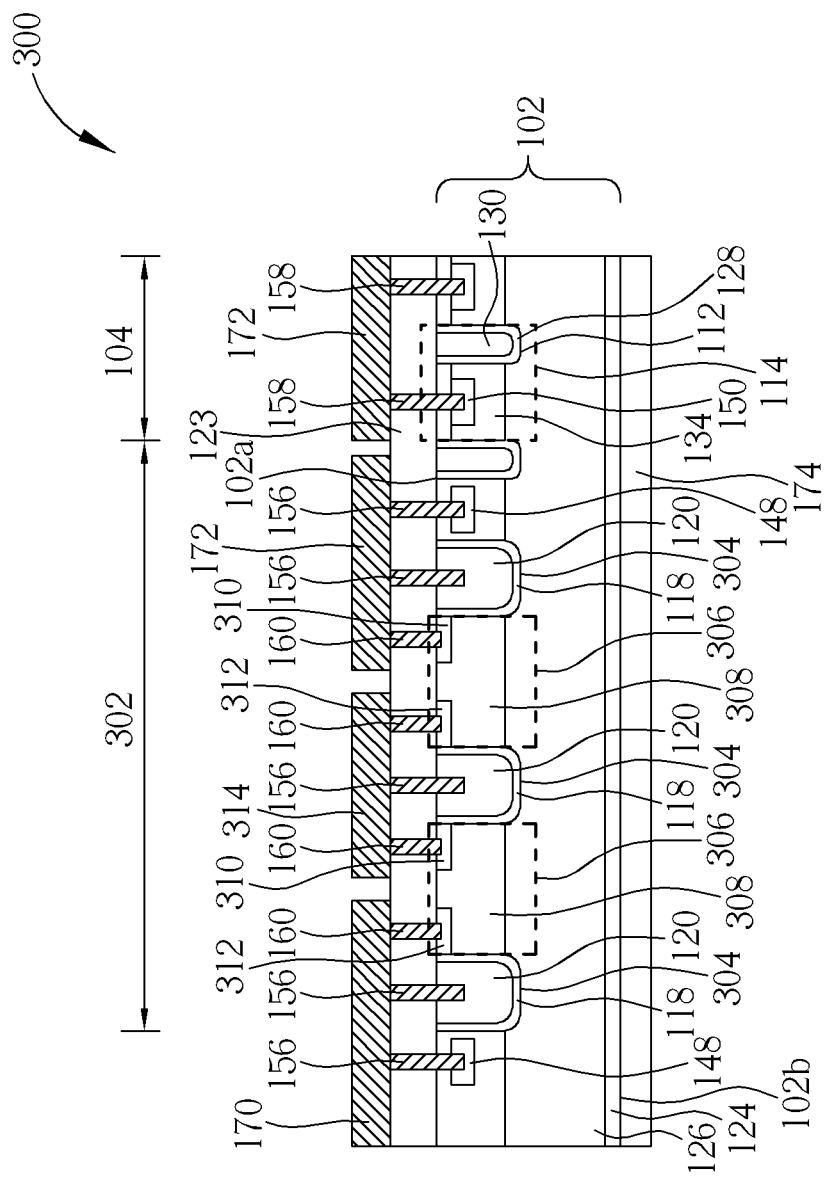
FIG. 10 is a schematic diagram illustrating a cross-sectional view of the power semiconductor device along a cutting line CC' shown in FIG. 9.

The power semiconductor device of the present invention is not limited to having ESD devices electrically connected between the gate electrode and the drain electrode. The power semiconductor device can also have ESD devices electrically connected between the gate electrode and the source electrode to avoid damage between the gate electrode and the source electrode due to electrostatic charges. Please refer to FIG. 9 and FIG. 10. FIG. 9 is a schematic diagram illustrating a top view of a power semiconductor device according to a third embodiment of the present invention, and FIG. 10 is a cross-sectional diagram taken along a cutting line CC' shown in FIG. 9. As shown in FIG. 9 and FIG. 10, compared to the first embodiment, the N-type semiconductor substrate 102 of the power semiconductor device 300 further includes a third component region 302, and the upper surface 102a of the N-type semiconductor substrate 102 further includes a plurality of second trenches 304 disposed in the third component region 302. In addition, the power semiconductor device 300 includes a plurality of second ESD devices 306 disposed in the N-type semiconductor substrate 102 between any two adjacent second trenches 304. Each second ESD device 306 includes a P-type fourth doped region 308, an N-type fifth doped region 310, and an N-type sixth doped region 312. The N-type sixth doped region 312 is disposed in the P-type fourth doped region 308 furthest from the first component region 104. Moreover, the power semiconductor device 300 includes at least a second connecting metal layer 314 disposed on the second trench 304 between any two adjacent second ESD devices 306. The N-type sixth doped region 312 of the second ESD device 306 located at a side of each second trench 304 close to the first component region 104 can be electrically connected to the N-type fifth doped region 310 of the second ESD device 306 located at a side of the second trench 304 away from the first component region 104 via the second connecting metal layer 314. In other words, between any two adjacent second ESD devices 306, the N-type fifth doped region 310 of the second ESD device 306 away from the first component region 104 can be electrically connected to the N-type sixth doped region 312 of the other second ESD device 306 close to the first component region 104 via the second connecting metal layer 314. Also, the N-type sixth doped region 312 of the second ESD device 306 furthest from the first component region 104 is electrically connected to the gate metal layer 170, so as to be electrically connected to the gate conductive layer 130 serving as the gate electrode of the trench type transistor device 114. The N-type fifth doped region 310 of the second ESD device 306 closest to the first component region 104 is electrically connected to the source metal layer 172, so as to be electrically connected to the N-doped source region 140 serving as the source electrode of the trench type transistor device 114. Therefore, the second ESD devices 306 can be electrically connected between the source electrode and the gate electrode of the trench type transistor device 114 in series. In the present invention, the power semiconductor device is not limited to including either the second ESD devices 306 or the first ESD devices 116. The power semiconductor device also can include both the first ESD devices 116 and the second ESD devices 306.

Figure 11:
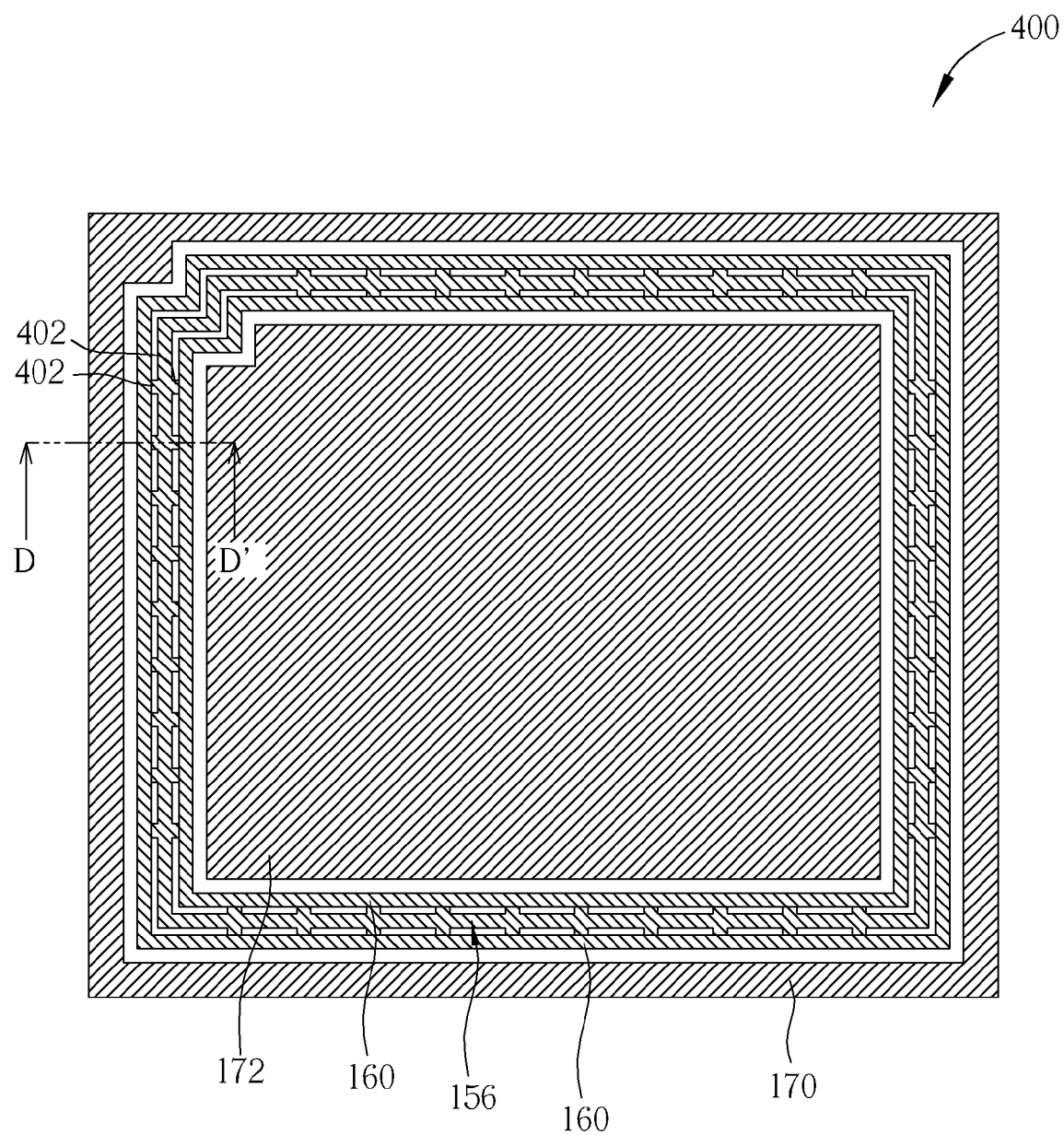
FIG. 11 is a schematic diagram illustrating a top view of a power semiconductor device according to a fourth embodiment of the present invention.
Figure 12:
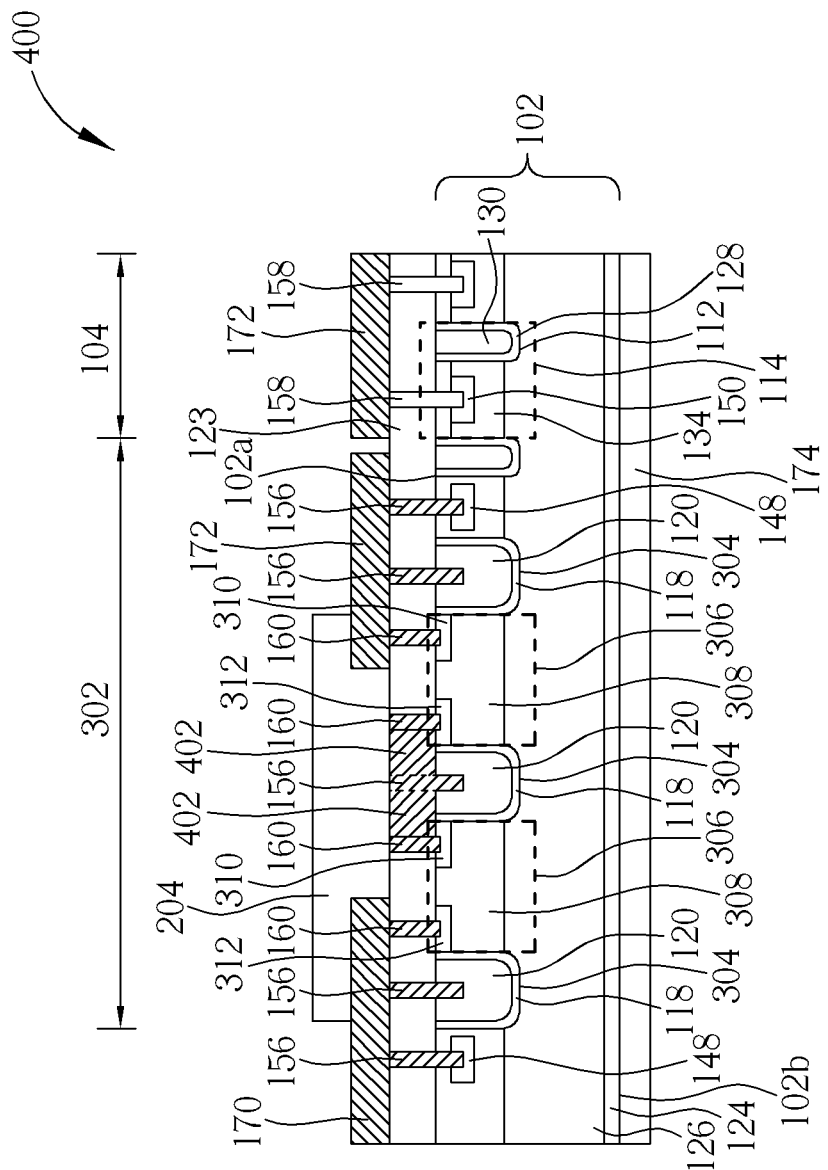
FIG. 12 is a schematic diagram illustrating a cross-sectional view of the power semiconductor device along a cutting line DD' shown in FIG. 11.

Additionally, in the present invention, each second ESD device is not limited to being electrically connected via the connecting metal layer. Each second ESD device also can be electrically connected via contact plug disposed across two adjacent second ESD devices. Please refer to FIG. 11 and FIG. 12. FIG. 11 schematically illustrates a top view of a power semiconductor device according to a fourth embodiment of the present invention, and FIG. 12 is a cross-sectional diagram taken along a cutting line DD' shown in FIG. 11. AS shown in FIG. 11 and FIG. 12, the power semiconductor device 400 does not include the second connecting metal layer electrically connecting the N-type fifth doped region 310 and an N-type sixth doped region 312 located at two sides of the second trench 304, as compared with the third embodiment. In this embodiment, each first contact plug 156 disposed between any two adjacent second ESD devices 306 further includes a plurality of second extended parts 402. Each second extended part 402 is extended to be in contact with the adjacent second contact plugs 160, so as to electrically connect the N-type fifth doped region 310 and the N-type sixth doped region 312 respectively located at two sides of the second trench 304.

To sum up, in the present invention, the first ESD devices are formed in the N-type semiconductor substrate made of monocrystalline silicon, so that the first ESD devices have lower resistance compared to other ESD devices made of polycrystalline silicon, and ability to discharge electrostatic charges is improved.

Those skilled in the art will readily observe that numerous modifications and alterations of the device and method may be made while retaining the teachings of the invention.

What is claimed is:

1. A power semiconductor device with an electrostatic discharge structure, comprising:
    a semiconductor substrate, having a first conductive type, wherein the semiconductor substrate comprises a first component region and a second component region, an upper surface of the semiconductor substrate has a plurality of first trenches, and the plurality of first trenches are disposed in the second component region;
    a plurality of first electrostatic discharge devices, each first electrostatic discharge device being embedded in the semiconductor substrate between any two of the plurality of first trenches adjacent to each other, and each first electrostatic discharge device comprising:
        a first doped region, having a second conductive type, wherein the second conductive type is different from the first conductive type, and the first doped region is in direct physical contact with the semiconductor substrate;
        a second doped region, having the first conductive type, and disposed in the first doped region, having the first conductive type, and disposed in the first
        a third doped region, having the first conductive type, and disposed in the first doped region away from the first component region;
    at least one trench type transistor device, disposed in the first component region, the at least one trench type transistor device comprising a gate electrode, a source electrode, and a drain electrode, wherein one of the second doped regions closest to the first component regions furthest from the first component region is electrically connected to the drain electrode, and the plurality of first electrostatic discharge devices are electrically connected in series between the gate electrode and drain electrode;
    an insulating layer, covering a wall of each first trench; and
    a conductive layer, disposed in each first trench, wherein the second doped region and the third doped region of each first electrostatic discharge device are electrically connected to the conductive layer disposed in the any two of the plurality of first trenches respectively, and any two of the first electrostatic discharge devices adjacent to each other are electrically connected to the conductive layer disposed in one of the plurality of first trenches disposed between the any two of the first electrostatic discharge devices.

2. The power semiconductor device with the electrostatic discharge structure according to claim 1, further comprising at least one first connecting metal layer disposed on the one of the plurality of first trenches, wherein the any two of the first electrostatic discharge devices are electrically connected to the conductive layer disposed in the one of the first trenches disposed between the any two of the first electrostatic discharge devices through the at least one first connecting metal layer.

3. The power semiconductor device with the electrostatic discharge structure according to claim 1, further comprising a plurality of first contact plugs disposed on the conductive layer disposed in the plurality of first trenches respectively.

4. The power semiconductor device with the electrostatic discharge structure according to claim 3, further comprising a plurality of second contact plugs disposed on the second doped region and the third doped region respectively.

5. The power semiconductor device with the electrostatic discharge structure according to claim 4, wherein a depth of each first contact plug is substantially deeper than a depth of each second contact plug.

6. The power semiconductor device with the electrostatic discharge structure according to claim 5, wherein one of the plurality of first contact plugs disposed between two the any two of the first electrostatic discharge devices adjacent to each other has at least an extended part extended to be in contact with two of the plurality of second contact plugs adjacent to the one of the plurality of first contact plugs.

7. The power semiconductor device with the electrostatic discharge structure according to claim 1, further comprising:
    a drain metal layer, disposed on the semiconductor substrate and electrically connected to the drain electrode and the one of the third doped regions furthest from the first component region; and
    a gate metal layer, disposed on the semiconductor substrate and electrically connected to the drain electrode and the one of the second doped regions closest to the first component region.

8. The power semiconductor device with the electrostatic discharge structure according to claim 1, wherein the semiconductor substrate further comprises a third component region located between the first component region and the second component region, and the upper surface of the semiconductor substrate comprises at least two second trenches disposed in the third component region, the power semiconductor device further comprising:
    at least one second electrostatic discharge device, disposed in the semiconductor substrate between the at least two second trenches, the at least one second electrostatic discharge device comprising:
        a fourth doped region, having the second conductive type;
        a fifth doped region, having the first conductive type, and disposed in the fourth doped region close to the first component region; and
        a sixth doped region, having the first conductive type, and disposed in the fourth doped region away from the first component region.

* * * * *